United States Patent [19]

Aaron et al.

[11] Patent Number: 4,865,710
[45] Date of Patent: Sep. 12, 1989

[54] MAGNETRON WITH FLUX SWITCHING CATHODE AND METHOD OF OPERATION

[75] Inventors: David B. Aaron, University City, Mo.; John D. Wiley, Madison, Wis.

[73] Assignee: Wisconsin Alumni Research Foundation, Madison, Wis.

[21] Appl. No.: 175,711

[22] Filed: Mar. 31, 1988

[51] Int. Cl.$^4$ ............................................. C23C 14/34
[52] U.S. Cl. .................................. 204/192.12; 204/298
[58] Field of Search ................. 204/192.12, 192.15, 204/298, 298 ME, 298 PS, 298 TS, 298 PM, 298 MM

[56] References Cited

U.S. PATENT DOCUMENTS

| | | | |
|---|---|---|---|
| 3,985,635 | 10/1976 | Adam et al. | 204/298 TS |
| 4,336,119 | 6/1982 | Gillery | 204/298 X |
| 4,401,539 | 8/1983 | Abe et al. | 204/298 X |
| 4,415,427 | 11/1983 | Hidler et al. | 204/298 PM |
| 4,444,635 | 4/1984 | Kobayashi et al. | 204/298 X |
| 4,569,746 | 2/1986 | Hutchinson | 204/298 |
| 4,588,942 | 5/1986 | Kitahara | 204/298 X |

Primary Examiner—Nam X. Nguyen
Attorney, Agent, or Firm—Quarles & Brady

[57] ABSTRACT

A magnetron sputtering apparatus is formed with a plurality of cells each for generating an independent magnetic field within a different region in the chamber of the apparatus. Each magnetic field aids in maintaining an ion plasma in the respective region of the chamber. One of a plurality of sputtering material targets is positioned on an electrode adjacent to each region so that said ions strike the target ejecting some of the target material. By selectively generating each magnetic field, the ion plasma may be moved from region to region to sputter material from different targets. The sputtered material becomes deposited on a substrate mounted on another electrode within the chamber. The duty cycle of each cell can be dynamically varied during the deposition to produce a layer having a graded composition throughout its thickness.

17 Claims, 3 Drawing Sheets

MAGNETRON WITH FLUX SWITCHING CATHODE AND METHOD OF OPERATION

This invention was made with United States government support awarded by the Department of Energy (DOE), grant No. DE-FG02-84ER45096. The United States government has certain rights in this invention.

The present invention relates to magnetron sputtering apparats for vapor deposition of material on a substrate, and particularly to such apparatus which have multiple targets of different materials.

BACKGROUND OF THE INVENTION

Sputtering apparatus are well known devices for depositing a layer of material on a substrate. One type of such apparatus incorporates a magnetron to create a vapor containing the deposition material. A typical magnetron sputtering system, generally designated as 10, is shown in FIG. 1. The system includes a vacuum chamber 13, having a cathode section 12 and an anode 14. The substrate 19 to be coated is attached to the anode 14. The cathode section 12 comprises several permanent magnets 16. A piece of the material 15 to be deposited is placed on the cathode section and is conventionally referred to as the target.

Prior to operating the magnetron sputtering system 10, the chamber 13 is evacuated by a pump (not shown) attached to port 18 and backfilled through inlet port 17 with an inert ionizable gas, such as argon, at low pressure. A high DC or radio frequency excitation potential is applied between the anode 14 and the cathode section 12. The permanent magnets 16 create a strong closed path magnetic field in region 11 above the target surface. This field traps electrons by forcing them to undergo cycloidal motion near the surface of the target 15. This motion has the effect of increasing the electron density near the target surface.

The inert gas is ionized by the collision of the gas atoms with electrons accelerated by the excitation potential. By increasing the electron density above the target 15, the ionization probability in this region 11 is also increased. As a result, a plasma is created between the anode 14 and cathode section 12. Positive gas ions from the plasma are accelerated toward the cathode section 12, striking the target 15. The momentum tranfer from the gas ions to the target 15 causes the ejection of some target material. The ejected target material is attracted to the anode 14 and becomes deposited on the substrate 19.

The basic system illustrated in FIG. 1 can deposit a single material, i.e. the target's material, at a time. If a composite material is to be deposited, a target of that composite must be fabricated. This fabrication may produce a target with impurities which will also be present in the deposited coating. In addition, if the proportion of the materials in the composite are to be changed, a new target must be fabricated.

Several modifications to the basic magnetron sputtering system have been devised to deposit composite materials. One approach has been to use a single target having regions of each constituent material and varying the shape of the plasma. This technique appears to be limited to a two material system where the target consists of one material annularly located about the other. In this approach, a second electromagnet coil is placed around the sputtering system between the cathode section and the bottom of the chamber. The magnetic field created by the second coil can be regulated to alter the diameter of the plasma and create an annular shaped plasma with varying inner and outer diameters. The shape of the plasma determines which one of the materials, or whether both of them, is deposited on the substrate at a given time.

SUMMARY OF THE INVENTION

A magnetron sputtering apparatus includes a chamber that contains an ionizable inert gas. A first electrode is within the sputtering chamber and includes a holder for substrate on which material is to be deposited. A magnetron assembly includes a second electrode assembly and has a plurality of cells, each of which generates a magnetic field in a different region within the cavity. In the preferred embodiment, each cell is defined by an electromagnet surrounded on several sides by a permanent magnet structure. Each cell generates a magnetic field which aids in the creation of a plasma of the inert gas ions in the respective region of the chamber. A mechanism is provided to hold different targets of materials to be deposited adjacent each region.

The general object of the present invention is to provide a magnetron sputtering apparatus that can deposit a composite coating on a substrate.

A specific object of the present invention is to provide such an apparatus whereby a composite coating is formed by sputtering material from a plurality of targets within the apparatus. Another object of the present invention is to provide a sputtering apparatus in which a plasma of gas ions can be translated above a plurality of targets to control the deposition of the material of the targets.

A further object is to provide such a translation without extinguishing the plasma.

Yet another object of the instant invention is to provide a magnetron sputtering apparatus which is capable of depositing a layer in which the proportion of constituent materials varies in a selected manner with the layer's thickness.

DETAILED DESCRIPTION OF THE PRESENT INVENTION

Figure 1:
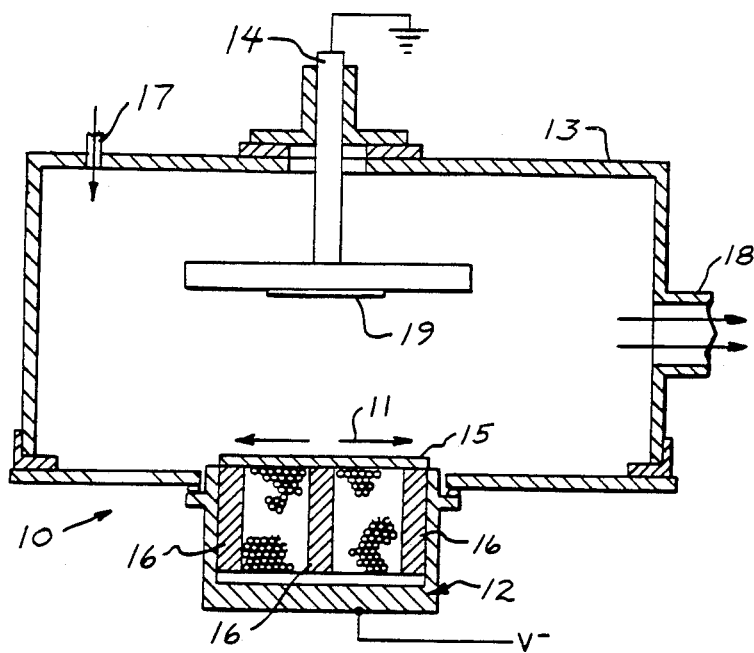
FIG. 1 is a cross-sectional view of a prior art sputtering apparatus.
Figure 2:
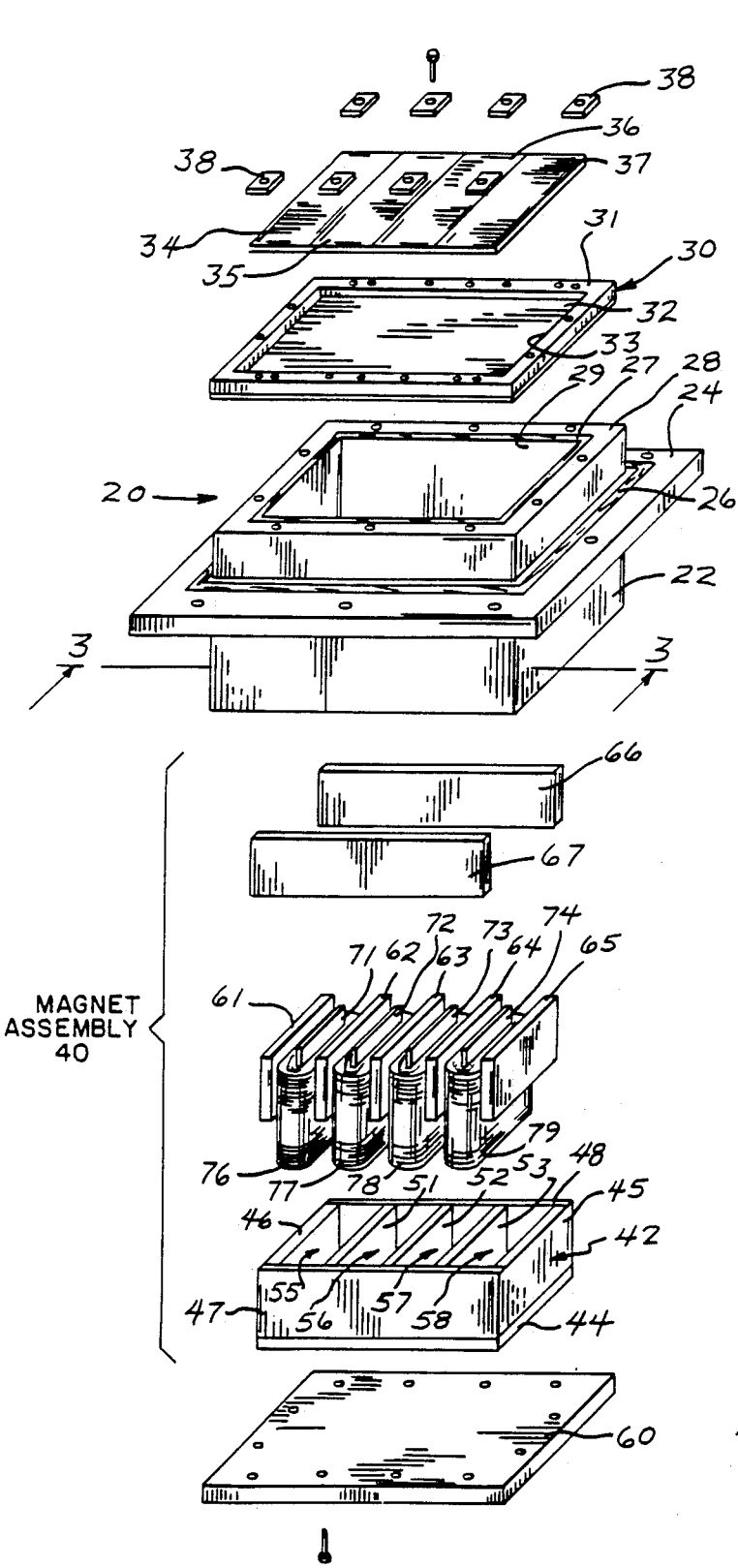
FIG. 2 is an exploded illustration of the novel magnetron section for a sputtering apparatus according to the present invention.

The sputtering apparatus according to the present invention is similar to the previous sputtering system shown in FIG. 1, except that the magnetron section 12 of that earlier system is replaced with the structure illustrated in FIG. 2. With reference to that latter Figure, the novel magnetron structure, generally designated 20, includes a conventional housing 22 which is formed of a single piece of aluminum for example. In the illustrated embodiment, the housing 22 has a generally rectangular tubular shape with an annular projection 24 for attaching the housing to the sputtering chamber 13'. A first O-ring 26 extends around the annular projection 24 to provide a seal between the housing and the sputtering chamber. A similar second 0-ring 27 is located on the upper end surface 28 of the housing and extends around central opening 29. A sputtering target retainer, generally designated 30, consists of a rectangular annular frame 31 with a back plate 32 extending across the underside of the frame. The frame 31 and its back plate 32 are fabricated of a magnetically permeable material, such as stainless steel. The target retainer 30 is fastened across the one end surface 28 of the cathode housing 22 by a series of periodically spaced machine screws.

Figure 3:
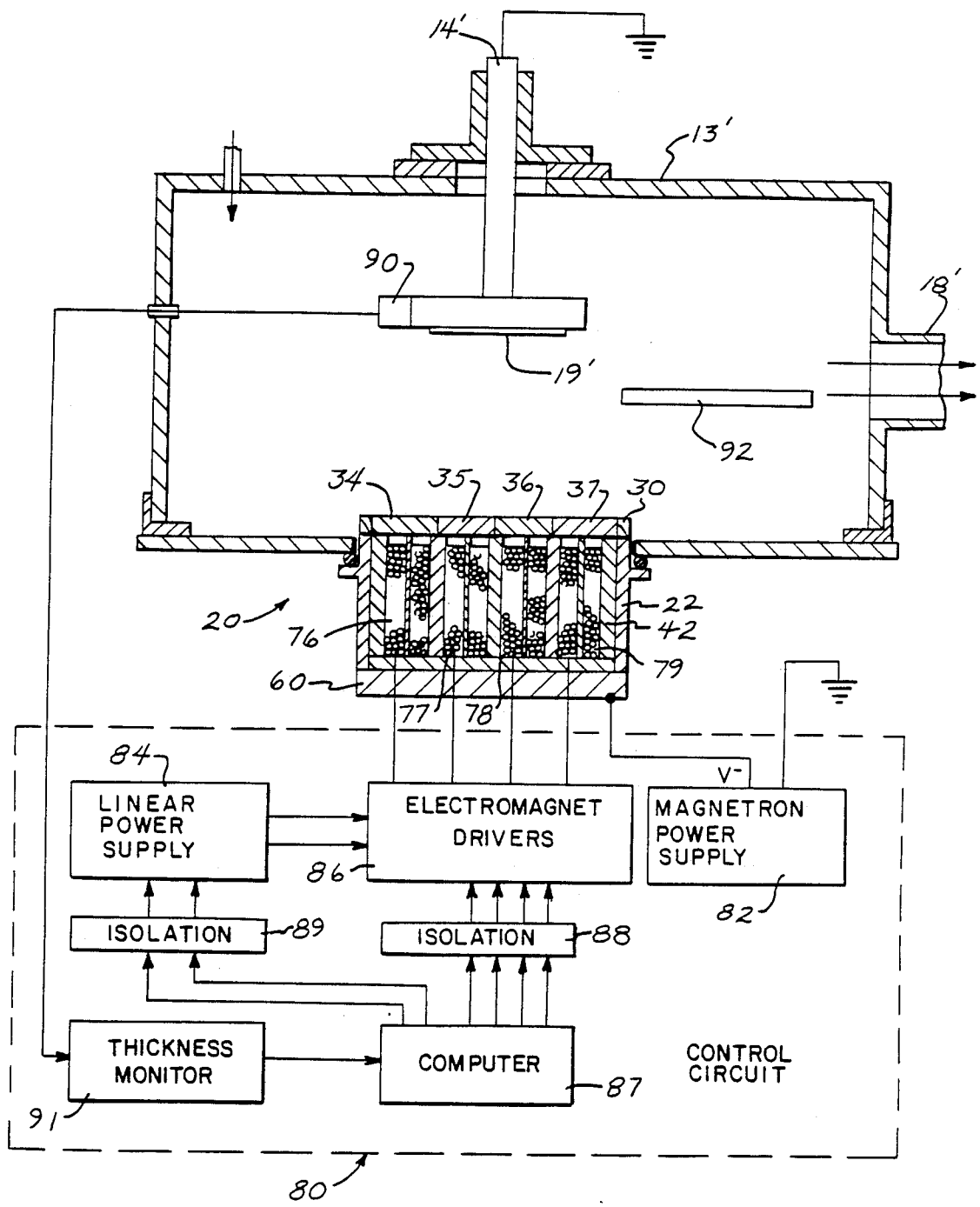
FIG. 3 is a cross section view of a sputtering apparatus according to the present invention.

Four separate sputtering material targets 34–37 are placed within a rectangular opening 33 of the annular frame 31 against the back plate 32. Each of the sputtering targets 34–37 is rectangular shaped with its length extending across the opening 33 of the frame 31. The four targets are placed in an abutting relationship so as to fill the entire opening of the frame 31. Each of the targets 34–37 is held within the frame opening 33 by a pair of target clamps 38 which are held against the frame 31 by machine screws. As shown in FIG. 3, the targets 34–37 and their retainer 30 are located within the sputtering chamber 13' when the cathode section 20 is assembled onto the sputtering apparatus. In this assembly, the targets 34–37 are parallel to be applied.

Referring again to FIG. 2, a magnet assembly 40 is located within the central opening 29 of the housing 22. The magnet assembly 40 includes a pole piece subassembly 42 formed of magnetic material, such as iron. The pole piece subassembly 42 has a generally box-like shape and includes a bottom plate 44 and four orthogonal outer sidewalls 45–48. Three interior walls 51–53 extend between and abut two parallel sidewalls 47 and 48 and are parallel to the other two sidewalls 45 and 46. The combination of the sidewalls 45–48 and the interior walls 51–53 form four cavities 55–58 within the pole piece subassembly 42.

One of five permanent magnets 61–65 extends upwardly from the exposed edge of each of the interior walls 51–53 and the two sidewalls 45 and 46 that are parallel to the interior walls. The length and thickness of each of the permanent magnets 61–65 matches the thickness and length of each of the walls from which they extend. Two additional permanent magnets 66 and 67 extend upwardly from a different one of the remaining sidewalls 47 and 48 of the pole piece subassembly 42 and abut the vertical ends of the first group of permanent magnets 61–65. In the illustrated embodiment, the south pole of each of the permanent magnets 61–67 is located against the corresponding wall of the pole piece subassembly 42. However, the poles of the permanent magnets 61–67 can be reversed with a corresponding reversal of the magnet section operation described below. The combined structure of the permanent magnets 61–67 is assembled to provide an extension of each of the walls of the pole piece subassembly 42 and of the four cavities 55–58.

One of four electromagnet coils 76–79 is located within each of the cavities 55–58, respectively, of the pole piece subassembly 42 and extends into the region between the assembly of permanent magnets 61–67. The coils 76–79 are wound around a core 71–74 of magnetic material. The longitudinal axis of each electromagnet coil 76–77 extends vertically in the orientation of the cathode section shown in FIG. 2.

The novel magnetron section 20 of FIG. 2 is shown mounted on a conventional sputtering chamber 13' in FIG. 3. The magnet assembly 40 abuts the underside of the target retainer 30 and is enclosed within the housing 22 by a lower cover 60 which may be formed of aluminum. Each of the electromagnet cores 71–74 abuts the bottom plate 44 of the pole piece assembly 42 and has a distal edge which is coplanar with the upper edge of each of the permanent magnets 61–67. The housing 22 and pole assembly 42 have a number of apertures therethrough (not shown) to allow water to flow through each cavity 55–58 for cooling the electromagnet coils 76–79.

Figure 4:
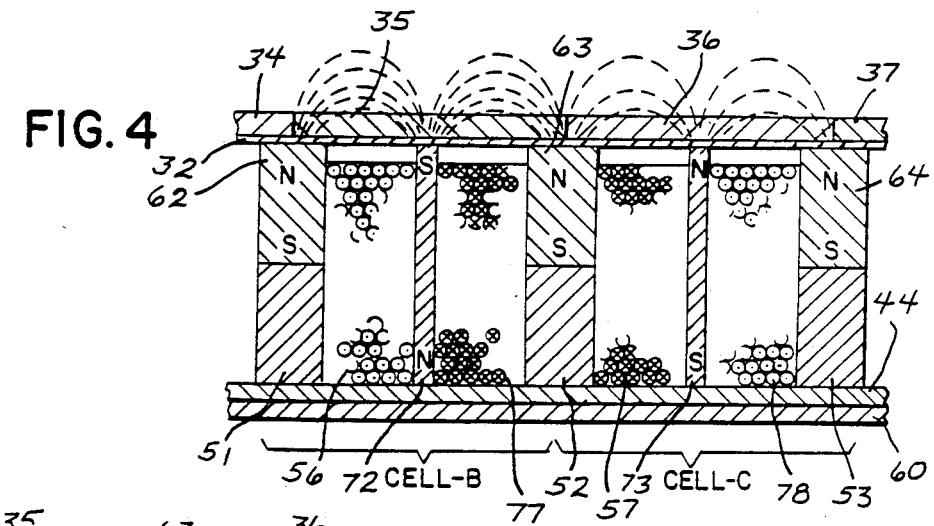
FIGS. 4 and 5 are partial cross-section views of the magnet structure of the cathode section of FIG. 2 in two different states of energization.
Figure 5:
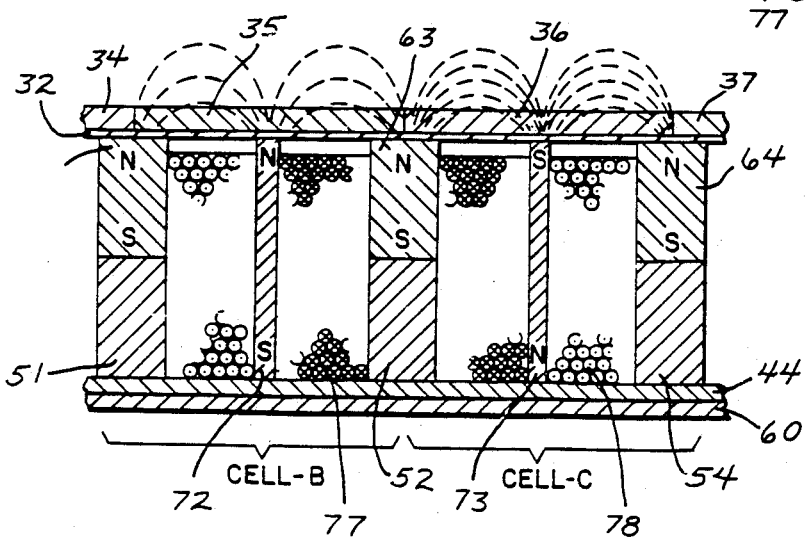

Each of the electromagnet coils 77–79 within the cavities 55–58 comprises a separate sputtering cell which when energized causes the material of the corresponding target 34–37 located above the cell to be sputtered. The middle two cells designated B and C are shown in FIGS. 4 and 5. Cell B is defined by cavity 56 and the adjacent permanent magnets, and cell C is defined by cavity 57 and its adjacent permanent magnets. The electromagnet coil 77 for cell B is wound around the core 72. Similarly, the electromagnet coil 78 for cell C is wound around its core 73.

Although the embodiment of the present invention described herein has four sputtering cells in a linear array, a greater or lesser number of cells may be incorporated. Furthermore, the cells can be arranged in a two dimensional pattern. In yet another variation of the present invention, the permanent magnets can be eliminated and the walls of the pole piece subassembly 42 extended upward. However, the magnetic bias provided by the permanent magnets is not present in this variation and higher currents must be applied to the electromagnets.

FIG. 3 also schematically illustrates the control circuit 80 for the magnetron section 20. The control circuit 80 includes a magnetron power supply 82 which provides a high DC voltage between the anode 14' and the housing 22 of the magnetron section 20. A linear power supply 84 provides positive and negative voltage sources for driving the four electromagnet coils 76–79. The output from the linear power supply 84 is coupled to a set of four electromagnet drivers 86 which switch either the positive or negative supply voltage to each of the electomagnets in response to a set of four control signals. A computer 87 generates the set of four electromagnet control signals which are coupled to the drivers 86 by an isolation circuit 88. The computer 87 also generates control signals for the linear power supply 84 which are coupled to it via another isolation circuit 89 to regulate the output voltages.

Within the sputtering chamber 13' is a conventional quartz sensor 90 for measuring the thickness of the material being deposited on the substrate 19'. As the sputtered material builds up on the surface of the sensor 90, the mass of the quartz changes thereby affecting its resonant frequency. The quartz sensor 90 is connected to a commerically available thickness monitor 91 which converts the change in the resonant frequency of the quartz sensor into an output signal indicating the thickness of the sputtered layer. The thickness monitor 91 contains a keypad for entering the properties of the material being sputtered so that it may convert the change in sensor frequency into the thickness measurement. The output of the thickness monitor 91 representing the thickness of the deposited layer is connected to the computer 87.

In preparation for the operation of the improved sputtering apparatus, a target 19' is mounted onto the anode 14' and the chamber 13' is sealed. The chamber is then evacuated via port 18 and backfilled with an ionizable inert gas, such as argon, to a pressure in the 5-10 millitorr range, for example. A DC bias voltage is applied by the magnetron power supply 82 between the anode 14' and the magnetron housing 22 which acts as a cathode. Typically, the anode 14' is at ground potential and the target retainer has a negative voltage (e.g. minus 200-1000 volts) applied to it. Alternatively, a radio frequency signal can be applied between the "anode" 14' and the magnetron housing 22. At this point, the apparatus is ready to begin sputtering materials from the targets.

During the operation of the present magnetron sputtering apparatus, one or more of the four sputtering cells is energized at a time to cause the material of the target 34-37, which is located above the cell, to be deposited on the substrate. This accomplished by the magnet control circuit 80 sending an electric current through the appropriate electromagnetic coil which will produce a strong magnetic field in the region above the surface of the corresponding target. For example, with reference to FIG. 4, if the material of target 35 is to sputtered, a current will be sent through the electromagnet coil 77 of cell B which will produce a south magnetic pole (designated by the letter S) at the end of the electromagnet core 72 which is closest to the target 35. This south pole of electromagnet enhances the magnetic field created by the permanent magnets 61-67 producing a relatively strong magnetic field above the surface of the target material 35 as indicated by the numerous magnetic flux lines running between the south pole of the electromagnet core 72 and the north pole of each of the adjacent permanent magnets 62 and 63 on either side of cell B. The return path of the magnetic flux runs through each of the walls 51 and 52 of the pole piece subassembly 42 and bottom plate 44 to the north pole of the electromagnet core 72. Due to the biasing effect provided by the permanent magnet structure around each electromagnet, only a relatively small electric current is required to generate the necessary magnetic field.

The strong magnetic field created by the electromagnet/permanent magnet combination within cell B traps electrons by forcing them to undergo cycloidal motion, thereby producing a high electron density in the region above the surface of the associated target 35. The magnetic field also traps the electrons away from the substrate 19' which reduces substrate heating due to electron bombardment. As described previously, the high electron density will produce a significant number of positive gas ions due to the collision of accelerated electrons with the inert gas atoms in this region. As a consequence, the strong magnetic field will produce a plasma of positive ions above this target 35. The positive ions are attracted to the negative potential of the target. The impact of the ions with the target ejects target material into the chamber 13'. The negatively charged ejected target material is attracted toward the substrate on the relatively positive anode.

At this time, the remaining cells, such as cell C in FIG. 4, have a current flowing through them in the opposite direction to produce a north pole at the edge of the electromagnet core 73 which is closest to the target 36 for that cell. As the north poles of the permanent magnets 63 and 64 on either side of cell C are also adjacent to the target 36, the current through the electromagnet coil 78 retards the flux from the permanent magnets producing a negligible electromagnetic field above the target. This negligible electromagnetic field will not produce a significantly large electron density within the chamber to create a plasma of ions above target 36. Therefore, sputtering will not occur at target 36, as well as, at the targets for the outer two cells A and D of the magnet assembly 40.

When the electromagnet coil 77 within cell B has been energized for a sufficient period of time to deposit the desired amount of its target material on the substrate 19', one of its adjacent cells, cell C for example, can then be energized to deposit its target material on the substrate. While cell B's coil 77 is still being energized to produce a strong magnetic field above target 35, the electromagnet coil 78 for cell C has its current flow reversed to produce a strong magnetic field above its target 36. For a brief moment, both of the cells B and C are producing strong magnetic fields above their respective targets 35 and 36. This enlarges the ion plasma so that it is briefly established in the regions above both targets 35 and 36.

Once a plasma has been established above cell C, the current flow through the electromagnet coil 77 of cell B is reversed to produce a negligible magnetic field above its target 35, as shown in FIG. 5. The decrease in the magnetic field above target 35 and the increased or strong magnetic field above cell C's target 36, causes the plasma of positive ions which was present above target 35 in FIG. 4 in effect to move laterally toward the strong magnetic field produced by cell C. The overlap in the intervals at which the coils in cells B and C are energized to produce strong magnetic fields, causes the plasma to be moved rather than to be extinguished when the current through the coil 77 of cell B is reversed to produce a negligible magnetic field above its target. With the ion plasma now located above the surface of cell C's target 36, its material will be sputtered and deposited on the substrate 19'.

Similarly, the ion plasma may be shifted into positions above the other two cells of the magnet assembly 40. By moving the plasma over each of the targets 34-37, their constituent materials are deposited on the surface of the substrate.

Prior to depositing the target material onto the substrate 19', a shutter 92 is positioned between the targets 34-37 and the substrate from its retracted position illustrated in FIG. 3. However, the shutter does not cover up the quartz sensor 90. Initially, the control circuit 80 individually activates each of the magnetron cells so that its target material is sputtered and deposited on the sensor 90. Each cell is activated for a predetermined length of time by computer 87 and the thickness of the material deposited during that interval is measured by the sensor 90 and the thickness monitor 91. The computer 87 uses the thickness information from the monitor 91 to determine the sputtering rate of the material from each of the targets 34-37. As each target is different, the sputtering rate will vary from cell to cell of the magnetron section 20.

Once the sputtering rate for each of the targets 34-37 has been determined, the shutter is moved out of the way into the position illustrated in FIG. 3 in preparation for depositing material on the substrate 19'. Each of the cells can be sequentially activated to form separate layers of their target materials on substrate 19'.

Although the present sputtering apparatus may be employed to deposit a number of separate layers of material onto the substrate 19', it is particularly well suited for the deposition of a composite film made up of materials from each of the four targets. With the operator knowing the percentage of each of the target materials in the desired film to be deposited, the duty cycle time for each of the sputtering cells can be calculated using the sputtering rates previously measured. The apparatus is then energized to commence the deposition. The first cell is energized for a computed period of time and then the plasma is moved to an adjacent cell to sputter its target material. Since the plasma is not extinguished for the transition from one cell to another, the switching among the cells and target materials is relatively rapid, on the order of a few milliseconds. Therefore, although in fact the sputtering of a material from each target is discontinuous in that only one target material is being sputtered at a time, the fast switching among cells has the effect of producing a homogeneous layer on the substrate 19' made up of constituents from each of the targets 34-37 in the predefined percentages.

As all of the constituent materials are present within the sputtering chamber, the proportion of each material within the deposited layer also can be varied during the sputtering process to produce a layer of material of substrate 19 having a graded composition throughout its thickness. By knowing the sputtering rate of each of the target materials, the duty cycle of each of the magnetron cells can be dynamically varied by the control circuit 80 during the sputtering process to alter the percentage of each of the constituent materials in the deposited film. Furthermore, by continuously monitoring the deposition by sensor 90 and thickness monitor 91, a continuous feedback of the deposition rate can be fed into the computer 87 so that changes in the cell duty cycles may occur should variation in the sputtering rates be detected during the actual deposition.

As noted previously, the present invention has been described with respect to an embodiment having four sputtering cells in a linear array. Other geometrical variations of the cells positions fall within the scope of the present invention. For example, two dimensional arrays of sputtering cells in various physical alignments are also contemplated. In addition, a greater or lesser number of cells may be provided in an apparatus according to the present invention. Furthermore a manual control circuit can be employed in place of the computerized one in FIG. 3. In this case, the operator would manually read the thickness measurements from monitor 91 and compute the deposition rates for each target material. The operator then either manually or with a mechanical timer regulates the duty cycle of each magnetron cell.

We claim:
1. A magnetron sputtering apparatus comprising:
a sputtering chamber;
a first electrode within said sputtering chamber and including means for holding an object on which material is to be deposited;
a magnetron assembly having a plurality of non-concentric cells each one having a separate electromagnet coil for generating an independent magnetic field in a different region within said sputtering chamber to maintain a plasma in that region, said cells being positioned with respect to each other so that a plasma maintained in one magnetic field region can be transferred to another region without extinguishing the plasma; and
a second electrode within said sputtering chamber having means for positioning adjacent each region a separate target of a material to be deposited on the object.

2. The apparatus as recited in claim 1 wherein each one of said cells further includes a permanent magnet means adjacent said electromagnet.

3. The apparatus as recited in claim 2 further comprising a control circuit for selectively applying a current to each of the electromagnets to establish a plasma in one of said regions and thereafter to translate said plasma between different ones of said regions.

4. The apparatus as in claim 3 wherein said control circuit includes means for determining the deposition rate of each of the separate targets.

5. The apparatus as in claim 3 wherein said control circuit includes means for regulating the duty cycle of each of said electromagnets to deposit on the object a layer of material having a composition comprising predetermined proportions of a plurality of the target materials.

6. The apparatus as recited in claim 1 wherein the plurality cells of said magnetron assembly are aligned adjacent one another.

7. The apparatus as recited in claim 1 further comprising means for selectively activating each of the cells to sequentially create a plasma in each of the magnetic field regions.

8. The apparatus as recited in claim 7 wherein said means for selectively activating each of the cells also includes means for controlling the interval that each cell is activated.

9. The apparatus as recited in claim 1 wherein said magnetron assembly comprises a plurality of electromagnets and a permanent magnet structure enclosing each of said electromagnets on four sides, the electromagnets and said permanent magnet structure being oriented with respect to each other so that when a given electromagnet is energized, lines of magnetic flux extend between that electromagnet and said permanent magnet structure.

10. The apparatus as recited in claim 1 further including means for selectively energizing each of the cells to translate a plasma formed within said sputtering chamber from one region to another.

11. A cathode structure for a sputtering apparatus comprising:
means for holding a plurality of targets of material to be sputtered; and
a magnetron assembly adjacent said means for holding and having a plurality of non-concentric cells each having a separate means for generating an independent magnetic field in a region adjacent one of the targets to maintain a plasma in that region, said cells being positioned with respect to each other so that a plasma maintained in one of the regions can be transferred to another of the regions without extinguishing the plasma.

12. The cathode as recited in claim 11 wherein each one of said cells is defined by an electromagnet which is energized to generate the independent magnetic field.

13. The cathode as recited in claim 12 wherein each of said cells further includes a permanent magnet means adjacent said electromagnet.

14. The cathode as recited in claim 11 wherein said magnetron assembly comprises a plurality of electromagnets and a permanent magnet structure enclosing each of said electromagnets on four sides, the electromagnets and said permanent magnet structure being oriented with respect to each other so that when a given electromagnet is energized, lines of magnetic flux extend between that electromagnet and said permanent magnet structure.

15. A method of sputtering materials onto a substrate using a magnetron sputtering apparatus having a plurality of cathode cells, each cathode cell for generating a magnetic field within a different region within the sputtering apparatus to establish a plasma within that region which causes sputtering of the material of a target positioned adjacent to the region, said method comprising selectively energizing said cathode cells to produce a translational movement of the center of the plasma from one region to another region.

16. A magnetron for a sputtering apparatus comprising:
 a magnetic pole assembly of a magnetic material forming a plurality of non-concentric cavities;
 a plurality of electromagnet coils each coil being located within a separate one of the cavities; and
 means for holding a separate sputtering target adjacent each cavity.

17. The magnetron as recited in claim 16 wherein said magnetic pole assembly includes a permanent magnet means around each cavity.

* * * * *

UNITED STATES PATENT AND TRADEMARK OFFICE
CERTIFICATE OF CORRECTION

PATENT NO. : 4,865,710
DATED : September 12, 1989
INVENTOR(S) : David B. Aaron et al.

It is certified that error appears in the above-identified patent and that said Letters Patent is hereby corrected as shown below:

In column 3, line 25, after "parallel to" insert -- and spaced from the substrate 19' on which the coating is to --.

In column 9, line 13, change "the" to --that--.

Signed and Sealed this

Fourteenth Day of August, 1990

Attest:

HARRY F. MANBECK, JR.

*Attesting Officer*  *Commissioner of Patents and Trademarks*